United States Patent [19]

Marcus

[11] Patent Number: 5,017,317
[45] Date of Patent: May 21, 1991

[54] GAS PHASE SELECTIVE BEAM DEPOSITION

[75] Inventor: Harris L. Marcus, Austin, Tex.

[73] Assignee: Board of Regents, The Uni. of Texas System, Austin, Tex.

[21] Appl. No.: 444,882

[22] Filed: Dec. 4, 1989

[51] Int. Cl.[5] .................. B29C 35/08; B29C 35/12; B29C 47/92; B23K 9/00

[52] U.S. Cl. .................. 264/81; 118/715; 118/50.1; 219/121.12; 219/121.36; 219/121.6; 219/121.8; 425/174; 427/38; 427/53.1; 427/255.1; 264/85

[58] Field of Search ............ 156/643, 272.2, 272.8, 156/345, 242; 264/81, 85; 425/174, 174.4; 118/715, 728, 50.1, 620; 427/12, 35, 38, 53.1, 248.1, 249, 255.1; 219/121.12, 121.15, 121.29, 121.36, 121.6, 121.8

[56] References Cited

U.S. PATENT DOCUMENTS

| | | | |
|---|---|---|---|
| 2,076,952 | 4/1937 | Kratky | 75/137 |
| 2,599,947 | 6/1952 | Sherman et al. | 118/118 |
| 2,918,896 | 12/1959 | Uhleen | 118/118 |
| 2,961,336 | 11/1960 | Uhleen | 118/118 X |
| 3,063,407 | 11/1962 | Bergstein | 118/104 |
| 3,243,317 | 3/1966 | Baker | 134/15 |
| 3,279,424 | 10/1966 | Brown et al. | 118/119 |
| 3,280,230 | 10/1966 | Bradshaw | 264/22 |
| 3,301,725 | 1/1967 | Frontera | 156/59 |
| 3,312,191 | 4/1967 | Lowe | 118/104 |
| 3,539,410 | 11/1970 | Meyer | 156/58 |
| 3,848,104 | 11/1974 | Locke | 219/121 |
| 3,911,174 | 10/1975 | Rose | 427/211 |
| 3,923,923 | 1/1976 | Diatteo | 29/407 |
| 3,985,995 | 10/1976 | Brandi | 219/76 |
| 4,117,302 | 9/1978 | Earle | 219/121.85 |
| 4,135,902 | 1/1979 | Oehrle | 65/2 |
| 4,270,675 | 6/1982 | Wicks et al. | 222/196 |

(List continued on next page.)

FOREIGN PATENT DOCUMENTS

| | | |
|---|---|---|
| 209366 | 1/1987 | European Pat. Off. |
| 2263777 | 7/1973 | Fed. Rep. of Germany |
| 137951 | 10/1979 | Fed. Rep. of Germany |
| 57-156959 | 3/1984 | Japan |
| 57-185536 | 5/1984 | Japan |
| 1215184 | 12/1970 | United Kingdom |

OTHER PUBLICATIONS

"Solid Freeform Fabrication and Selective Powder Sintering", Proceedings, 15th Conference on Production Research and Technology, University of California, Berkley (1989) pp. 623–628.

(List continued on next page.)

Primary Examiner—William A. Powell
Attorney, Agent, or Firm—Arnold, White & Durkee

[57] ABSTRACT

A method and apparatus for selectively depositing a layer of material from a gas phase to produce a part comprising a plurality of deposited layers. The apparatus includes a computer controlling a directed energy beam, such as a laser, to direct the laser energy into a chamber substantially containing the gas phase to preferably produce photodecomposition or thermal decomposition of the gas phase and selectively deposit material within the boundaries of the desired cross-sectional regions of the part. For each cross section, the aim of the laser beam is scanned over a target area and the beam is switched on to deposit material within the boundaries of the cross-section. Each subsequent layer is joined to the immediately preceding layer to produce a part comprising a plurality of joined layers. In an alternate embodiment of the present invention, a gas phase is condensed on a surface and a laser beam is used to selectively evaporate, transform, activate or decompose material in each layer. A subsequent layer is condensed and the evaporation, transformation, activation or decomposition step is repeated to produce a part comprising a plurality of joined layers. The apparatus of the present invention preferably comprises a computer controlled laser generating and scanning system aiming at least one laser beam into a chamber comprising at least one gas phase and controlling the aim and selectively depositing or evaporating material to produce a part.

38 Claims, 2 Drawing Sheets

U.S. PATENT DOCUMENTS

| | | | |
|---|---|---|---|
| 4,292,342 | 9/1981 | Sarma et al. | 264/81 |
| 4,300,474 | 11/1981 | Livsey | 118/641 |
| 4,323,756 | 4/1982 | Brown | 219/121.85 X |
| 4,474,861 | 10/1984 | Ecer | 428/614 |
| 4,503,096 | 3/1985 | Specht | 427/359 |
| 4,540,867 | 9/1985 | Ackerman | 219/121 |
| 4,575,330 | 3/1986 | Hull | 425/174.4 |
| 4,752,352 | 6/1988 | Feygin | 427/53.1 |
| 4,758,388 | 7/1988 | Hamada et al. | 264/81 X |
| 4,818,562 | 4/1989 | Arcella et al. | 156/630 |
| 4,863,538 | 9/1989 | Deckard | 156/62.2 |

OTHER PUBLICATIONS

"Sculpting Parts with Light", Machine Design (Mar. 6, 1986) pp. 102–106.

"Laser-Cut Laminations Form Complex Parts", Machine and Tool Blue Book (Apr. 1987).

"Immediate Production of 3-D Objects", Hydronetics, Inc.

"Lasers Carve Complex 3-D Parts", (pp. 1–11).

Sample cover letter from Hydronetics, Inc.

Chicago Enterprise, vol. I, No. II (May 1987).

Crane's Chicago Business (1987).

Laser Focus/Electro-Optics, p. 41 (Jun. 1987).

Inside R & D, The Weekly Report on Technical Innovation, vol. 16, No. 19, (May 13, 1987).

Electronic Engineering Times, Issue 430 (Apr. 20, 1987).

"Rhenium Film Preparation by Laser Melting", Journal of Applied Physics, pp. 2903–2908 (May 1980).

Massey, A. G. et al., "The Direct Synthesis of Non--Transition-Metal Organo Derivatives", Aldrichimica Acta, vol. 22, No. 2, 1989.

GAS PHASE SELECTIVE BEAM DEPOSITION

BACKGROUND OF THE INVENTION

I. Field of the Invention

This invention relates to a method and apparatus utilizing a directed energy beam to selectively deposit material from a gas phase or selectively evaporate material condensed from a gas phase to produce a part. In particular, this invention relates to a method of producing a part utilizing a computer-assisted laser or other directed energy beam apparatus which sequentially deposits or evaporates material from a gas phase to build a desired part in a layer by layer fashion.

II. Description of the Relevant Art

The economies associated with conventional part production methods are generally related directly to the quantity of parts to be produced and the desired material characteristics of the finished parts. For example, large scale manufacture casting and extrusion techniques are often cost effective, but these production methods are generally unacceptable for small quantities—i.e. replacement parts or prototype production. Many such conventional part production methods require expensive part specific tooling. Even powder processing requires a die for shaping the powder, making powder processing unattractive as a method for producing a small number of parts.

Where only a small number of parts are desired, conventional production methods involving a subtractive machining method are usually used to produce the desired part. In such subtractive methods, material is cut away from a starting block of material to produce a more complex shape. Examples of subtractive machine tool methods include: milling, drilling, grinding, lathe cutting, flame cutting, electric discharge machine, etc. While such conventional machine tool subtractive methods are usually effective in producing the desired part, they are deficient in many respects.

First, such conventional machine tool subtractive methods produce a large amount of waste material for disposal. Further, such machine tool methods usually involve a large initial expense for setting up the proper machining protocol and tools. As such, the set-up time is not only expensive, but relies a great deal on human judgment and expertise. These problems are, of course, exacerbated when only a small number of parts are to be produced.

Another difficulty associated with such conventional machining techniques involves tool wear—which not only involves the cost of replacement, but also reduces machining accuracy as the tool wears. Another limit on the accuracy and tolerance of any part produced by conventional machining techniques is the tolerance limits inherent in the particular machine tool. For example, in a conventional milling machine or lathe, the lead screws and ways are manufactured to a certain tolerance, which limits the tolerances obtainable in manufacturing a part on the machine tool. Of course, the tolerances attainable are reduced with age of the machine tool.

The final difficulty associated with such conventional machine tool subtractive processes is the difficulty or impossibility of making many part configurations. That is, conventional machining methods are usually best suited for producing symmetrical parts and parts where only the exterior part is machined. However, where a desired part is unusual in shape or has internal features, the machining becomes more difficult and quite often, the part must be divided into segments for production. In many cases, a particular part configuration is not possible because of the limitations imposed upon the tool placement on the part. Thus, the size and configuration of the cutting tool do not permit access of the tool to produce the desired configuration.

There are other machining processes which are additive, for example, plating, cladding, and some welding processes are additive in that material is added to a starting substrate. In recent years, other additive-type machining methods have been developed which use a laser beam to coat or deposit material on a starting article. Examples include U.S. Pat. Nos. 4,117,302; 4,474,861; 4,300,474; and 4,323,756. These recent uses of lasers have been primarily limited to adding a coating to a previously machined article. Often such laser coating methods have been employed to achieve certain metallurgical properties obtainable only by such coating methods. Typically, in such laser coating methods the starting article is rotated and the laser directed at a fixed location with the coating material sprayed onto the article so that the laser will melt the coating onto the article.

Additionally, a process for utilizing a laser to sinter a powder has been suggested in U.S. Pat. No. 4,863,538 and a process for compressing a powder-based material into a coherent mass prior to sintering has been suggested in U.S. Pat. No. 4,752,352.

A difficulty associated with previously suggested selective sintering methods relates to the problem of evenly depositing the layers of powder for sintering.

SUMMARY OF THE INVENTION

The problems outlined above and problems involved in powder handling in a laser sintering process are in large measure solved by the method and apparatus of the present invention. The present invention provides a method of producing a part on a macroscale or a microscale. A macroscale part typically comprises structural dimensions greater than about 10 microns and may further comprise suspended spans or overhanging structures within the part. A microscale part typically does not contain suspended spans or overhanging structures and may embody structural dimensions less than 10 microns.

A preferred method of the present invention comprises the steps of positioning a first gas phase proximate a target area, scanning the aim of at least one directed energy beam relative to the target area and selectively depositing material from the first gas phase in a first layer on the target area, positioning a second gas phase proximate the target area, scanning the aim of at least one directed energy beam across the target area and selectively depositing material from the second gas phase in a second layer on the target area. This second scanning step further includes the substeps of joining the first and second layers during the scanning and depositing of the second layer and positioning successive gas phases over the target area and scanning the aim of at least one directed energy beam over the target area and selectively depositing material to produce successive layers joined to a previously deposited layer and producing a part comprising a plurality of these joined layers. Successive gas phases, including but not limited to, the first and second gas phases, may comprise substantially identical chemical compositions.

In a preferred embodiment, a non-binding easily removable material enables suspended spans or overhang structures to be formed in a subsequent layer immediately above the easily removable material. A secondary process, including, but not limited to, boiling, shaking, or a selective chemical reaction enables removal of the easily removable material having the suspended span or overhang structure in position.

The present invention may be utilized to produce parts comprising simple or multicomponent metals, ceramics, polymers, composites and combinations thereof.

The gas phases described throughout this application may comprise a plurality of gases including but not limited to organometallic, hydrocarbon, chloride, fluoride, oxide, nitride or polymer precursor gases. As used throughout this document, the term gas phases includes but is not limited to multicomponent gases and gas plasmas. Further, as used throughout this document, the terms gas phase and gas carrier include but are not limited to gases and gas plasmas. Each scanning step preferably either thermally decomposes or photodecomposes the proximate gas phase to deposit material in the target area. Additionally, the wavelength or wavelengths from the energy beam or beams is selectable to selectively deposit material from the desired gas phase. Further, the target area may be selectively heated, to selectively deposit material from the gas phase and may further selectively dissociate gas molecules of the gas phase.

Another method of producing a part in accordance with the present invention comprises the steps of positioning a plurality of gas phases proximate a target area, scanning the aim of at least one directed energy beam relative to the target area and selectively depositing material from the gas phases in a first layer on the target area. Subsequently, the aim of at least one directed energy beam is scanned across the target area and material is selectively deposited from the gas phases in a second layer on the target area, including the substeps of joining the first and second layers during the scanning and depositing of the second layer and successively scanning the aim of at least one directed energy beam across the target area and selectively depositing material to produce successive layers joined to a previously deposited layer and producing a part comprising a plurality of joined layers. In a preferred embodiment, the plurality of gas phases comprises gas phase precursor and gas carrier materials and plasmas thereof including but not limited to one or more combinations of $CH_4$, $C_2H_2$, $C_2H_4$, $C_2H_6$, Y $CO_2$, $Al_2(CH_3)_6$, $H_2$, He, Ar, $Ni(CO)_4$, $Fe(CO)_5$, $N_2O$, $SiH_4$, $Si_2H_6$, $TiCl_4$, $BCl_3$ and $WF_6$. Further, the selectively deposited material preferably comprises one or more combinations of directly deposited materials including but not limited to amorphous C, graphitic C, diamond, TiN, $Ti_4C_3$, SiC, $Si_3N_4$, $SiO_2$, $TiB_2$, Ni, Al, Fe, W, Si, $Al_2O_3$, $TiO_2$ and TiC. A preferred embodiment enables the direct deposit of composite materials in a predetermined shape.

Each scanning step further comprises the substep of selecting at least one wavelength of the energy beam or beams to selectively deposit material from the plurality of gas phases. In a preferred embodiment the selected beam wavelength enables the selective thermal decomposition of the plurality of gas phases. In another preferred embodiment, the selected beam wavelength enables the selective photodecomposition of the plurality of gas phases. In still another preferred embodiment, the selected beam wavelength enables selective thermal and photo decomposition of the plurality of gas phases. Each scanning step further comprises the substep of selectively heating the target area to selectively deposit material from the gas phases and further to selectively dissociate gas molecules of the gas phases.

The plurality of gas phases preferably comprises a plurality of organometallic, hydrocarbon, chloride, fluoride, oxide, nitride or polymer precursor gases and carrier gases including but not limited to He, Ar, $H_2$ and $N_2$.

Yet another method of the present invention comprises the steps of positioning a first gas phase proximate a surface, controlling the temperature of the surface and enabling a portion of the first gas phase to condense in a first layer on the surface and scanning the aim of at least one first directed energy beam relative to across the surface and selectively evaporating material from the first layer. A supplemental first gas phase may, as appropriate, be positioned proximate the surface, condensed and selectively evaporated. The supplemental first gas phase preferably comprises an easily removable material including, but not limited to, $Si_2H_6$, $C_3H_8$, and Ar, enabling suspended spans or overhang structures to be formed in a subsequent layer immediately above the condensed supplemental first gas phase material. The easily removable material utilized in the fabrication of suspended spans and overhang-type structures also includes, but is not limited to, powders.

Subsequently, a second gas phase is positioned proximate the surface. The temperature of the surface is controlled and enables a portion of the second gas phase to condense on the first layer, and the aim of at least one first directed energy beam is scanned across the surface selectively evaporating material from the second layer including the substeps of joining the first and second layers during the condensing and scanning of the second layer and positioning successive gas phases proximate the surface, controlling the temperature of the surface and enabling a portion of the successive gas phases to condense and join in successive layers on the surface, and scanning the aim of at least one first directed energy beam across the surface and selectively evaporating layers of material and producing a part comprising a plurality of joined layers. Further, each scanning step preferably also comprises the step of scanning the aim of at least one second directed energy beam across the surface and selectively decomposing the deposited gas in each layer of material. Additionally, each scanning step preferably further comprises the substep of controlling the wavelength or wavelengths of each directed energy beam or beams.

Following formation of the spans or overhang structures, the easily removable material is preferably removed by a secondary process. A secondary process includes but is not limited to, boiling, shaking, or a selective chemical reaction.

Still another method of the present invention comprises the steps of positioning a first gas phase proximate a surface, controlling the temperature of the surface and enabling a portion of the first gas phase to condense in a first layer on the surface, scanning the aim of at least one first directed energy beam across the surface and selectively transforming material in the first layer into a material having a higher melting temperature than the condensed first gas phase material, positioning a second gas phase proximate the surface, controlling the temperature of the surface and enabling a portion of the second gas phase to condense on the first layer, scanning the aim of at least one first directed energy beam across the surface and selectively transforming material in the second layer into a material having a higher melting temperature than the condensed second gas phase material including the substeps of joining the first and second layers during the condensing and scanning of the second layer and positioning successive gas phases proximate the surface, controlling the temperature of the surface and enabling a portion of the successive gas phases to condense and join in successive layers on the surface and scanning the aim of at least one first directed energy beam across the surface and selectively transforming layers of the material and producing a part comprising a plurality of joined layers. Additionally, each scanning step preferably comprises the further step of scanning the aim of at least one second directed energy beam across the surface and selectively decomposing each layer of material. Each step of scanning preferably further comprises the substep of controlling the wavelengths of at least one directed energy beam.

An additional method of the present invention provides a method of forming an integral three-dimensional object comprising the steps of positioning a target in a chamber substantially able to contain a gas, introducing a gas phase into the chamber, utilizing means for directing an energy beam into the target area to change a property of at least part of the gas phase to deposit a layer of material and repeating the depositing and utilizing steps to form a plurality of these layers each of these layers being integrally bonded to the next adjacent layer by the utilizing steps to form an integral three-dimensional object.

An apparatus of the present invention for producing a part comprises a chamber housing a target area where the chamber enables substantial containment of a gas phase, a system for introducing a gas phase into the chamber, a system for selectively producing at least one directed energy beam, a system for directing the beam to the target area and for scanning the target area with the aim of the beam in a selective pattern, a system for controlling the operation of the beam to selectively deposit material from the gas phase on the target area during the scanning pattern including a computer system operatively coupled to the directing system to monitor the aim of the beam during the scanning pattern. The computer system is preferably programmed with information indicative of the desired boundaries of a plurality of cross-sectional regions of the part, the computer system further preferably being operable for modulating the beam when the aim of the beam is within the desired boundaries of the first cross-sectional region to deposit a first layer of material in the target area, and being able to modulate the beam when the aim of the beam is within the desired boundaries of the second cross-sectional region to deposit a second layer of material and join the first and second layers of material, and the computer system further modulating the beam when the aim of the beam is within succeeding desired boundaries of succeeding cross-sectional regions to deposit succeeding layers of material to join the layers to form the desired part.

Preferably, the computer system is programmed to the desired boundaries of a plurality of serial arranged parallel cross-sectional regions of the part. In an alternative preferred embodiment, the computer system is programmed with the overall dimensions and configuration of the part and the computer system is operative to numerically divide the part into a plurality of serial, parallel, discrete, cross-sectional regions and is able to derive the desired boundaries for each region.

In a preferred embodiment, the scanning system comprises a pair of mirrors driven by respective galvonometers. In another preferred embodiment, the scanning system comprises a system for positioning the target area relative to the beam. Further, in all preferred embodiments of the present invention the directed energy beam preferably comprises at least one laser beam, ion beam, electron beam, focused plasma beam, or combination thereof.

Depositing material in accordance with the present invention avoids problems of leveling and evenly depositing material associated with attempts to mechanically deposit layers of powder in a target area for sintering by a laser beam. Depositing material utilizing the present invention preferably produces level layers joined together to form the desired part. Further, in an alternate embodiment utilizing the present invention to evaporate material condensed from a gas phase to produce the desired part, level layers are also produced and the problems associated with evenly distributing a layer of powder for sintering are largely avoided.

DETAILED DESCRIPTION OF THE PREFERRED EMBODIMENTS

Figure 3:
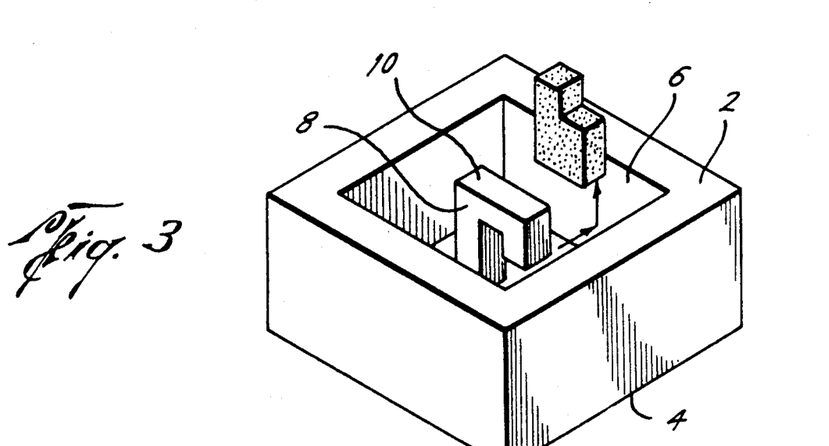
FIG. 3 is a perspective view of the part of FIG. 2.

Turning now to the drawings, the method and apparatus of the present invention enable the fabrication of a variety of parts. The parts fabricated utilizing the present invention are preferably parts with structural dimensions greater than approximately 10 microns. FIG. 3 illustrates such a part. Example part 2 shows outer base structure 4 with cavity 6 positioned within part 2. Pillar 8 and overhang 10 extending from pillar 8 are positioned within cavity 6.

Figure 1:
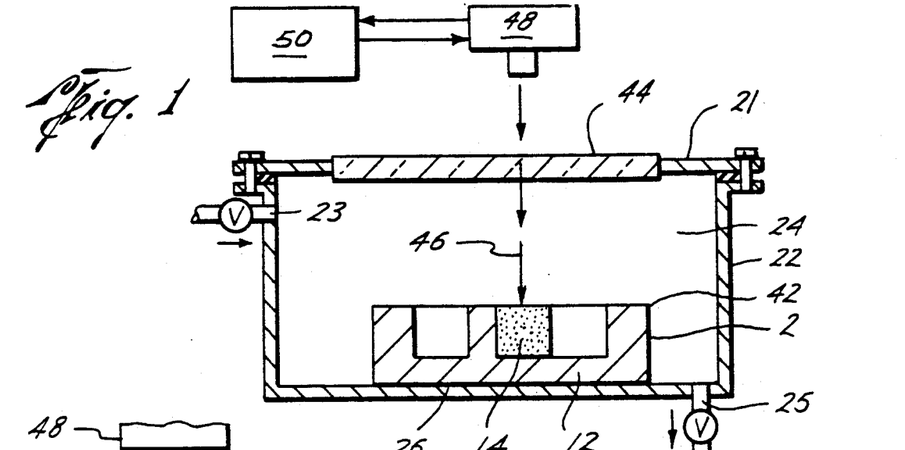
FIG. 1 is a sectional view of a first preferred apparatus and an example part in accordance with the present invention.

FIG. 1 shows part 2 within chamber 22 surrounded by gas phase 24 which is substantially contained in chamber 22. Gas inlet and valve 23 allow gas phase 24 to enter chamber 22. Gas outlet and valve 25 allow gas phase 24 to exit chamber 22. Top of chamber 22 is preferably removable to enable removal of part 2. Gas phase 24 is preferably an organometallic, hydrocarbon, chloride, fluoride, oxide, nitride or polymer precursor gas or a plurality of said gases including but not limited to He, Ar, $H_2$ and $N_2$. Organometallic gases include but are not limited to $Al_2(CH_3)_6$, $Ni(CO)_4$ and $Fe(CO)_5$. Hydrocarbon gases include but are not limited to $CH_4$, $C_2H_2$, $C_2H_4$ and $C_2H_6$. Polymer precursor gases include but are not limited to alkyl halides and amines. A gas phase preferably comprises a gas or gases having the properties of decomposing, sintering and/or polymerizing when exposed to directed energy beams that supply a sufficient thermal, decomposition or dissociation energy.

Figure 2:
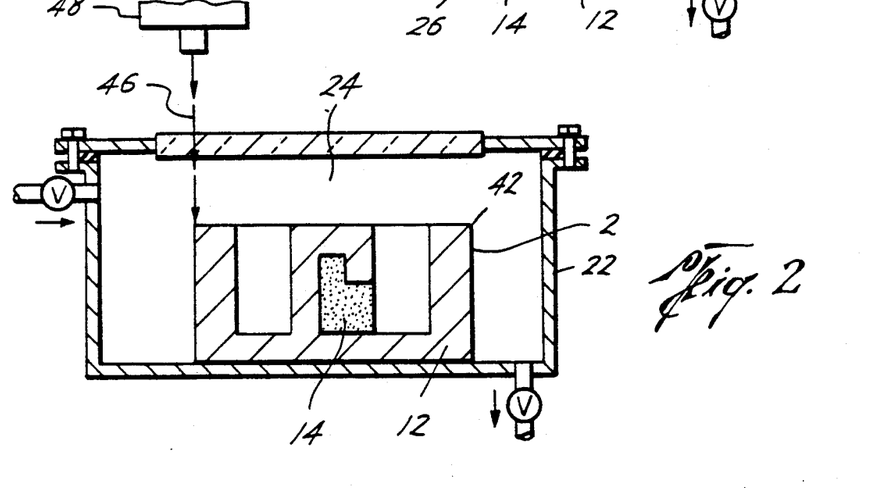
FIG. 2 is a sectional view of the part of FIG. 1, substantially near completion.

FIGS. 1 and 2 show an apparatus for producing parts in accordance with the present invention. By way of example, the part to be produced, part 2, is located within chamber 22. Gas phase 24 is substantially contained within chamber 22. Chamber 22 further comprises a beam transparent window 44 through which laser beam or beams 46 may pass. The laser beam is generated by laser beam generating and scanning system 48 which is controlled by computer control 50. In operation, computer control 50 preferably contains information sufficient to determine the two-dimensional image of each of the plurality of layers to be deposited to form part 2. This information is transferred to laser beam generating and scanning system 48 to control laser beam 46. Laser beam 46 scans each successive top layer 42 during the fabrication of part 2 and is selectively operative to deposit binding material 12 or non-binding material 14 from gas phase 24 in the necessary pattern to produce each layer of part 2. Laser beam 46 will be active where material deposits are necessary to fabricate the current top layer 42 of part 2. Removable top of chamber 21 enables removal of completed part 2 from chamber 22. U.S. Pat. No. 4,863,538 discloses use of a computer to control a laser beam generating and scanning system, the disclosure of which is expressly incorporated herein by reference.

Where it is desired to produce a suspended span or an overhang structure in the part to be formed, preferably a non-binding, easily removable material 14 is deposited in an appropriate layer or layers prior to the first layer defining the suspended span or overhang structure. A non-binding material preferably serves to support the suspended span or overhang structure during fabrication of the part and, due to the non-binding nature of the material, can be easily removed by a secondary process. Removal preferably is performed after fabrication of the part thereby leaving the suspended span or overhang structure. Successive gas phases 24 enable the successive depositing of binding material 12 and non-binding material 14.

Returning to FIGS. 1 and 2, in a preferred embodiment, gas phase 24 may comprise a plurality of gases or a plurality of gas phases. Laser beam 46 may comprise a single laser beam or a plurality of laser beams coordinated to selectively thermally decompose, photodecompose, or otherwise decompose gas phase 24 to deposit material on target area 26.

The computer control 50 and laser beam generating and scanning system 48 preferably enable control of the amount of energy produced in laser beam 46 and the wavelength of laser beam 46. Therefore, in a preferred embodiment wherein gas phase 24 comprises a plurality of gases, a selected level of energy or a selected wavelength or a combination thereof for laser beam 46 enables the selective decomposition of gas phase 24. The decomposition of gas phase 24 results in the deposition of material from the gas phase on top layer 42 creating a new top layer. A laser beam of differing power or wavelength than the initial laser beam may then be activated by computer control 50 and laser beam generating and scanning system 48 to decompose a second gas phase and deposit a subsequent top layer of material 42 from the second gas phase. In this preferred embodiment, layers of differing materials may be deposited selectively from the plurality of gases comprising gas phase 24. Clearly, a single layer may contain area of a first deposited material and a second area of a second deposited material by providing a first gas phase and selectively scanning the energy beam across the first area and then providing a second gas phase and selectively scanning the energy beam across the second area.

In an alternate preferred embodiment, a single gas phase 24 is placed in chamber 22 through gas inlet and valve 23. Laser beam 46 thermally decomposes or photodecomposes gas phase 24 producing top layer 42. The process may be repeated to produce a second layer or the gas phase may be evacuated from chamber 22 through gas outlet and valve 25 and replaced with another gas phase before a subsequent top layer 42 is deposited.

Additionally, laser beam 46 may selectively heat target area 26 to selective dissociate gas molecules from gas phase 24 and deposit material in target area 26.

By way of example, where the gas phase comprises $C_2H_2$ and $H_2$ and the laser beam has an approximate energy of 20 watts at a wavelength of 0.15 microns (um), the material glassy carbon will be deposited in the target area.

By way of further example, a catalyst may be combined with the gas phase to deposit selected material in the target area to produce a part. Using $Ni(CO)_4$ as a gas precursor for a Ni catalyst and $C_2H_2$ as a gas phase with a laser beam having an approximate energy of 20 watts and a wavelength of 10.6 um, the material graphite may be deposited.

Figure 5:
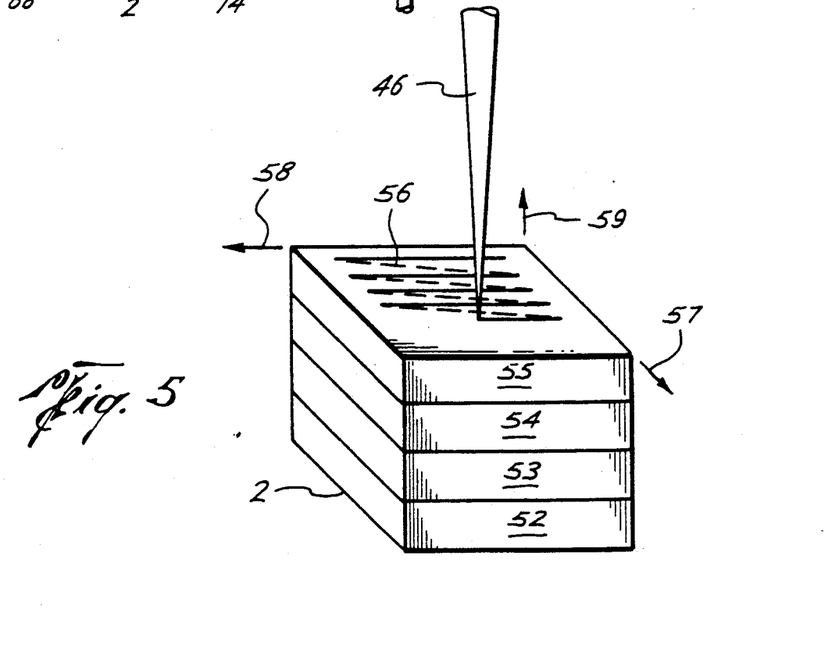
FIG. 5 is a schematic showing a portion of the layered buildup of a part produced in accordance with the present invention, and illustrating a raster scan pattern of the laser beam in the target area.

Still another preferred embodiment of the present invention comprises the steps of positioning a first gas phase 24 proximate target area 26. The temperature of target area 26, and preferably chamber 22, is controlled enabling target area 26 to be at a temperature below that of the walls of chamber 22, enabling a portion of first gas phase 24 to condense in a first layer on the surface of target area 26. Turning additionally to FIG. 5, layer 52 is the first condensed layer of part 2. Laser beam 46 scans target area 26 and selectively evaporates material from layer 52. The process is repeated as shown by layers 53, 54 and 55. FIG. 5 illustrates laser beam 46 scanning layer 55 of material condensed from a gas phase. FIG. 5 illustrates raster scan pattern 56 with beam 46 selectively scanning along axis 58. The selective scan continues as the beam progresses along axis 57 until the desired area has been scanned and the appropriate layer of example part 2 completed. The part is built up, layer by layer, in the direction of axis 59. As in all preferred embodiments of the present invention, the invention enables the creation of suspended spans or overhang structures in a part. As previously described, a non-binding layer or layers of material is deposited to support the suspended span of overhang structure during fabrication. The non-binding material is then removable through a secondary process including but not limited to boiling, shaking or a selective chemical reaction. When the non-binding material is removed, the suspended span or overhang structure remains in the part.

Yet another preferred embodiment of the present invention comprises the steps positioning a first gas phase 24 proximate target area 26. Temperature of target area 26 is controlled and enables a portion of first gas phase 24 to condense in a first layer on the surface of target area 26. Laser beam 46 scans across surface 52, as shown in FIG. 5, and selectively activates material from layer 52. The selectively activated material is transformed into a material having a higher melting temperature than the condensed first gas phase material. The process is repeated. The part is built up, layer by layer, as in all preferred embodiments, where each layer is selectively scanned and joined to the preceding layer. As in all preferred embodiments of the present invention, suspended spans or overhang structures are preferably fabricated in a part by utilizing non-binding material, such as a lower melting temperature phase material, in the layer or layers beneath the suspended spans or overhang structures so that when the temperature of target area 26 is increased, the non-activated condensed gas phase evaporates leaving the selectively activated material deposited.

Where material is condensed on target area 26 prior to scanning, gas phase 24 preferably comprises gases having a boiling point below the controllable ambient temperature of chamber 22. By way of example, gas phase 24 may comprise, but is not limited to, polymer precursors such as $C_2H_2$, $CH_3Cl$ and $(CH_3)_2NH$.

FIG. 5 illustrates the present invention evaporating undesired sections from each layer of part 2. Conversely, FIG. 1 illustrates the selective depositing of material in the appropriate layers of part 2.

All preferred embodiments of the present invention preferably include the substep of joining each layer of a binding material during the buildup process. Where material is selectively deposited, laser 46 deposits each successive layer and joins a newly deposited layer to the previously deposited layer to produce a part comprising a plurality of joined layers.

Where laser beam 46 evaporates condensed material to form a layer, each layer is joined to the previous layer preferably during the condensing of the material. This produces a part comprising a plurality of joined layers.

Figure 4:
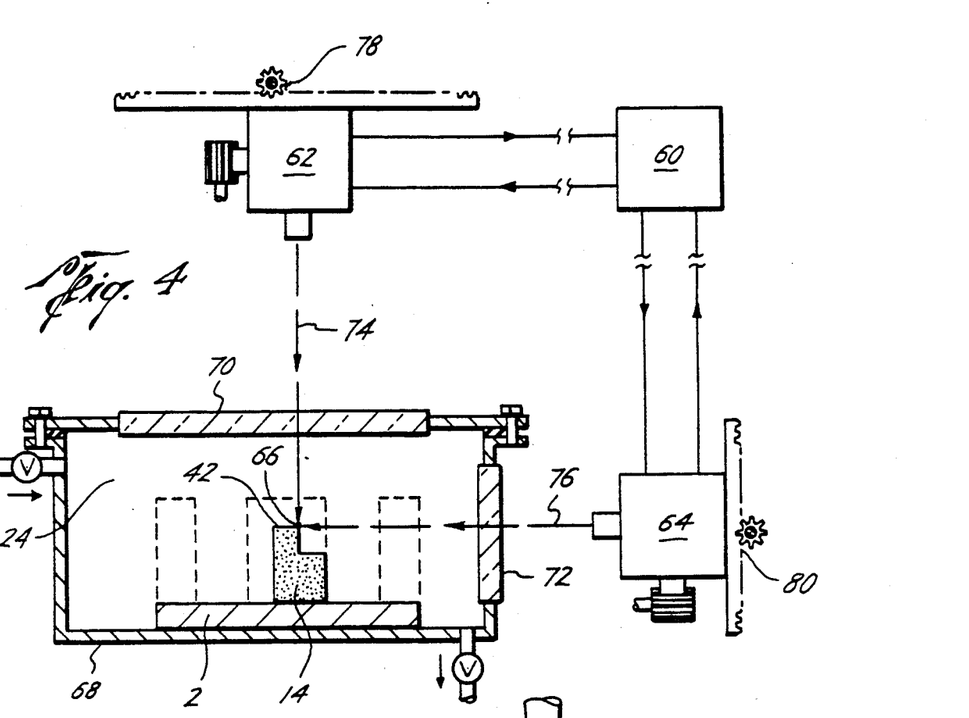
FIG. 4 is a diagram of a second preferred apparatus in accordance with the present invention.

In all preferred embodiments of the present invention, the computer control is enabled to either determine the boundaries of a plurality of cross-sectional regions of part 2 after being programmed with the desired boundaries of the finished part or is programmed with the desired boundaries of a plurality of serially-arranged, parallel cross-sectional regions of part 2.

Where a plurality of laser beams are utilized in the present invention, the beams may be used in an additive manner to produce a desired energy level or combination of wavelengths at only the point at which the multiple laser beams are focused, referred to as the active point. A preferred embodiment utilizing two laser beams is shown in FIG. 4. Example part 2 is contained in chamber 68 and chamber 68 substantially contains gas phase 24. Computer control 60 preferably controls both first laser beam generating and scanning system 62 and second laser beam generating and scanning system 64. First laser beam 74 from first laser beam system 62 and second laser beam 76 from second laser beam system 64 enter chamber 68 through first beam transparent window 70 and second beam transparent window 72, respectively. First laser beam 74 and second laser beam 76 intersect and are preferably focused at active point 66. Laser beams 74 and 76 are preferably chosen to produce the desired level of laser energy or the desired combination of wavelengths to produce a desired material decomposition producing a material deposition on top layer 42 of part 2.

Where a plurality of laser beams are utilized, gas phase 24 preferably comprises a plurality of gases comprising characteristics enabling thermal decomposition or photodecomposition. Gases comprising these characteristics include, but are not limited to $C_2H_2$, $(CH_3)_2NH$ and $Ni(CO)_4$.

In an alternate preferred embodiment, active point 66 produces a desired evaporation of condensed material from top layer 42. Where a plurality of laser beams are used to evaporate material condensed from gas phase 24, gas phase 24 preferably comprises a plurality of gases comprising characteristics enabling controlled boiling in the areas exposed to the beams. Gases comprising these characteristics include, but are not limited to alkyl halides, amines and hydrocarbons mixed with carrier gases where the carrier gases include but are not limited to He, Ar and $H_2$.

Clearly, a plurality of lasers may be utilized in the present invention and the lasers may be positioned at a plurality of angles about a desired active point. The 90° angle between laser beam 74 and laser beam 76 shown in FIG. 4 is merely illustrative of a particular preferred embodiment utilizing multiple beams and is not a limitation of the method or apparatus of the present invention.

FIG. 5 further illustrates first laser positioner 78 and second laser positioner 8 both preferably controllable by computer control 60. As will be clear to one skilled in the art, controllable mirrors and other known systems are utilizable to control the positions of laser beams 74 and 76.

Further modifications and alternative embodiments of the apparatus and method of the present invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements or materials may be substituted for those illustrated and described herein, parts may be reversed, and certain features of the invention may be utilized independently of the use of other features, all as would be apparent to one skilled in the art after having the benefit of this description of the invention.

I claim:

1. A method of producing a part comprising the steps of:

positioning a first gas phase proximate a target area;

scanning the aim of at least one directed energy beam relative to said target area and selectively depositing material from said first gas phase in a first layer on said target area;

positioning a second gas phase proximate said target area;

scanning the aim of at least one directed energy beam relative to said target area and selectively depositing material from said second gas phase in a second layer on said target area, including the substeps of joining said first and second layers during the scanning and depositing of the second layer; and positioning successive gas phases over said target area and scanning the aim of at least one directed energy beam over said target area and selectively depositing material to produce successive layers joined to a previously deposited layer and producing a part comprising a plurality of joined layers.

2. The method of claim 1 wherein said first and second gas phases comprise at least one gas selected from the group consisting of organometallic, hydrocarbon, chloride, fluoride, oxide, nitride and polymer precursor gases.

3. The method of claim 1 wherein said first and second gas phases comprise substantially identical chemical compositions.

4. The method of claim 1 wherein each said scanning step comprises the substep of thermally decomposing at least one of each said gas phases.

5. The method of claim 1 wherein each said scanning step comprises the substep of photodecomposing at least one of each said gas phases.

6. The method of claim 1 wherein each said scanning step further comprises the substep of selecting at least one wavelength of said at least one energy beam to selectively deposit material from said gas phase.

7. The method of claim 6 wherein said wavelength selection substep further comprises the substep of selectively decomposing said gas phase.

8. The method of claim 1 wherein each said scanning step further comprises the substep of selecting at least one wavelength of said at least one energy beam to selectively decompose said gas phase.

9. The method of claim 1 wherein each said scanning step further comprises the substep of selectively heating said target area to selectively deposit material from said gas phase.

10. The method of claim 9 wherein said selectively heating substep further comprises the substep of selectively dissociating gas molecules of said gas phase.

11. The method of claim 1 wherein said at least one directed energy beam comprises at least one laser beam.

12. The method of claim 1 wherein said at least one directed energy beam comprises at least one ion beam.

13. The method of claim 1 wherein said at least one directed energy beam comprises at least one electron beam.

14. The method of claim 1 wherein said at least one directed energy beam comprises at least one focused plasma beam.

15. A method of producing a part comprising the steps of:
positioning a plurality of gas phases proximate a target area;
scanning the aim of at least one directed energy beam relative to said target area and selectively depositing material from said gas phases in a first layer on said target area;
scanning the aim of at least one directed energy beam across said target area and selectively depositing material from said gas phases in a second layer on said target area, including the substeps of
joining said first and second layers during the scanning and depositing of the second layer; and
successively scanning the aim of at least one directed energy beam across said target area and selectively depositing material to produce successive layers joined to a previously deposited layer and producing a part comprising a plurality of joined layers.

16. The method of claim 15 wherein said plurality of gas phases comprises gas phase composite materials and said selectively deposited material comprises composite material.

17. The method of claim 15 wherein said plurality of gas phases comprises a plurality of gases selected from the group consisting of organometallic, hydrocarbon, chloride, fluoride, oxide, nitride and polymer gases.

18. The method of claim 15 wherein each said scanning step comprises the substep of selecting at least one wavelength of said at least one energy beam to selectively deposit material from said plurality of gas phases.

19. The method of claim 18 wherein each said wavelength selecting substep comprises the substep of selecting said at least one wavelength and enabling said at least one energy beam to selectively decompose said plurality of gas phases.

20. The method of claim 15 wherein each said scanning step further comprises the substep of selectively heating said target area to selectively deposit material from said gas phases.

21. The method of claim 20 wherein said selectively heating substep comprises the substep of selectively dissociating gas molecules of said gas phases.

22. A method of producing a part comprising the steps of:
positioning a first gas phase proximate a surface;
controlling the temperature of said surface and enabling a portion of said first gas phase to condense in a first layer on said surface;
scanning the aim of at least one first directed energy beam relative to said surface and selectively evaporating material from said first layer;
positioning a second gas phase proximate said surface;
controlling the temperature of said surface and enabling a portion of said second gas phase to condense on said first layer;
scanning the aim of said at least one first directed energy beam across said surface and selectively evaporating material from said second layer
including the substeps of
joining the first and second layers during the condensing and scanning of the second layer; and
positioning successive gas phases proximate said surface, controlling the temperature of said surface and enabling a portion of said successive gas phases to condense and join in successive layers on said surface, and scanning the aim of at least one first directed energy beam across said surface and selectively evaporating layers of said material and producing a part comprising a plurality of joined layers.

23. The method of claim 22 wherein each said scanning step further comprises the step of scanning the aim of at least one second directed energy beam across said surface and selectively decomposing said gas in each said layer of material.

24. The method of claim 22 wherein each said step of scanning further comprises the substep of controlling wavelengths of said at least one directed energy beam.

25. A method of producing a part comprising the steps of:
positioning a first gas phase proximate a surface;
controlling the temperature of said surface and enabling a portion of said first gas phase to condense in a first layer on said surface;
scanning the aim of at least one first directed energy beam relative to said surface and selectively transforming material in said first layer into a material having a higher melting temperature than said condensed first gas phase material; positioning a second gas phase proximate said surface;

controlling the temperature of said surface and enabling a portion of said second gas phase to condense on said first layer;

scanning the aim of said at least one first directed energy beam across said surface and selectively transforming material in said second layer into a material having a higher melting temperature than said condensed second gas phase material;

including the substeps of joining the first and second layers during the condensing and scanning of the second layer; and positioning successive gas phases proximate said surface, controlling the temperature of said surface and enabling a portion of said successive gas phases to condense and join in successive layers on said surface, and scanning the aim of at least one first directed energy beam across said surface and selectively transforming layers of said material and producing a part comprising a plurality of joined layers.

26. The method of claim 25 wherein each said step of scanning further comprises the step of scanning the aim of at least one second directed energy beam across said surface and selectively decomposing each said layer of material.

27. The method of claim 25 wherein each said step of scanning further comprises the substep of controlling wavelengths of said at least one directed energy beam.

28. A method of forming an integral three-dimensional object, comprising the steps of:

positioning a target in a chamber substantially able to contain a gas phase;

introducing said gas phase into said chamber;

utilizing means for directing an energy beam into the target area to change a property of at least part of said gas phase to deposit a layer of material; and repeating said depositing and utilizing steps to form a plurality of said layers, each of said layers being integrally bonded to the next adjacent of said layers by said utilizing steps to form an integral three-dimensional object.

29. An apparatus for producing a part comprising:

a chamber housing a target area;

means for introducing a gas phase into said chamber;

means for selectively producing at least one directed energy beam;

means for directing said beam to said target area and for scanning said target area with the aim of said beam in a selective pattern;

means for controlling the operation of said beam to selectively deposit material from said gas phase on said target area during said scanning pattern, including computer means operatively coupled to the directing means to monitor the aim of said beam during the scanning pattern;

said computer means being programmed with information indicative of the desired boundaries of a plurality of cross-sectional regions of said part;

said computer means being operable for modulating said beam when the aim of said beam is within the desired boundaries of the first cross-sectional region to deposit a first layer of material in said target area, and for modulating said beam when the aim of said beam is within the desired boundaries of the second cross-sectional region to deposit a second layer of material and join said first and second layers of material, and for modulating said beam when the aim of said beam is within succeeding desire boundaries of succeeding cross-sectional regions to deposit succeeding layers of material and join said layers to form said part.

30. The apparatus of claim 29 wherein said chamber substantially contains said gas phase.

31. The apparatus of claim 29, wherein said computer means being programmed with the desired boundaries of a plurality of serially-arranged, parallel, cross-sectional regions of said part.

32. The apparatus of claim 29 wherein, the computer means being programmed with the overall dimensions and configuration of said part, the computer means further being operative to numerically divide said part into a plurality of serial, parallel, discrete, cross-sectional regions and to derive the desired boundaries for each region.

33. The apparatus of claim 29 wherein said directed energy beam comprises at least one laser beam.

34. The apparatus of claim 29 wherein said directed energy beam comprises at least one ion beam.

35. The apparatus of claim 29 wherein said directed energy beam comprises at least one electron beam.

36. The apparatus of claim 29 wherein said directed energy beam comprises at least one focused plasma beam.

37. The apparatus of claim 29 wherein said scanning means comprises a pair of mirrors driven by respective galvonometers.

38. The apparatus of claim 28 wherein said scanning means comprises means for positioning said target area relative to said at least one directed energy beam.

* * * * *